(12) United States Patent
Liu et al.

(10) Patent No.: US 9,966,417 B2
(45) Date of Patent: May 8, 2018

(54) COLOR DISPLAY DEVICE

(71) Applicant: Shenzhen China Star Optoelectronics Technology Co., Ltd., Shenzhen, Guangdong (CN)

(72) Inventors: Yawei Liu, Guangdong (CN); Yifan Wang, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 261 days.

(21) Appl. No.: 14/424,347

(22) PCT Filed: Oct. 31, 2014

(86) PCT No.: PCT/CN2014/089958
§ 371 (c)(1),
(2) Date: Feb. 26, 2015

(87) PCT Pub. No.: WO2016/061842
PCT Pub. Date: Apr. 28, 2016

(65) Prior Publication Data
US 2016/0254324 A1    Sep. 1, 2016

(30) Foreign Application Priority Data

Oct. 20, 2014  (CN) .......................... 2014 1 0558424

(51) Int. Cl.
*H01L 51/52* (2006.01)
*H01L 51/56* (2006.01)
(Continued)

(52) U.S. Cl.
CPC .......... *H01L 27/3213* (2013.01); *G02B 5/201* (2013.01); *G02B 5/206* (2013.01);
(Continued)

(58) Field of Classification Search
CPC .... H01L 27/322; H01L 51/50–51/5028; H01L 51/5012–51/5044
See application file for complete search history.

(56) References Cited

U.S. PATENT DOCUMENTS

| 2010/0176380 A1* | 7/2010 | Jung | .................... C07D 213/30 257/40 |
| 2014/0231790 A1* | 8/2014 | Fujino | .................. H01L 27/322 257/40 |

(Continued)

FOREIGN PATENT DOCUMENTS

| CN | 101622732 A | 1/2010 |
| CN | 103474451 A | 12/2013 |

*Primary Examiner* — Mariceli Santiago
(74) *Attorney, Agent, or Firm* — Andrrew C. Cheng

(57) ABSTRACT

The present invention provides a color display device, including a substrate, an anode formed on the substrate, a TFT array formed on the anode, a hole injection layer formed on the TFT array, a hole transporting layer formed on the hole injection layer, a white light emission layer formed on the hole transporting layer, an electron transporting layer formed on the white light emission layer, a cathode formed on the electron transporting layer, a cover plate disposed above the cathode and bonded to the substrate, a color change layer formed on an inside surface of the cover plate, and a sealing enclosure resin bonding the substrate and the cover plate together, wherein the color change layer includes a blue sub-pixel zone, a green sub-pixel zone, a red sub-pixel zone, and a white sub-pixel zone that are spaced from each other, the blue sub-pixel zone including a blue light filter layer formed therein, the green sub-pixel zone including a green light filter layer or a green light change layer formed therein, the red sub-pixel zone including a red light filter layer or a red light change layer formed therein, the white sub-pixel zone comprising no filter layer formed therein.

10 Claims, 4 Drawing Sheets

(51) Int. Cl.
*H01L 27/32* (2006.01)
*H01L 51/00* (2006.01)
*G02B 5/20* (2006.01)
*H01L 27/12* (2006.01)
*H01L 51/50* (2006.01)

(52) U.S. Cl.
CPC ........ *H01L 27/322* (2013.01); *H01L 27/3262* (2013.01); *H01L 51/0008* (2013.01); *H01L 51/5036* (2013.01); *H01L 51/5246* (2013.01); *H01L 27/1214* (2013.01); *H01L 27/3244* (2013.01); *H01L 51/0035* (2013.01); *H01L 51/0037* (2013.01); *H01L 51/0054* (2013.01); *H01L 51/0061* (2013.01); *H01L 51/0067* (2013.01); *H01L 51/0072* (2013.01); *H01L 51/0081* (2013.01); *H01L 51/0085* (2013.01); *H01L 51/5056* (2013.01); *H01L 51/5072* (2013.01); *H01L 51/5088* (2013.01); *H01L 51/56* (2013.01); *H01L 2251/301* (2013.01); *H01L 2251/5338* (2013.01); *H01L 2251/5369* (2013.01)

(56) References Cited

U.S. PATENT DOCUMENTS

2014/0367651 A1* 12/2014 Song ................... H01L 51/5228
257/40
2015/0228697 A1* 8/2015 Liu ..................... H01L 51/5221
257/40

* cited by examiner

COLOR DISPLAY DEVICE

BACKGROUND OF THE INVENTION

1. Field of the Invention

The present invention relates to the field of displaying technology, and in particular to a color display device.

2. The Related Arts

An OLED (Organic Light-Emitting Diode) is a flat panel displaying technique of extremely prosperous future and it shows excellent displaying performance and also possesses various advantages, such as being self-luminous, simple structure, being ultra-thin, fast response, wide view angle, low power consumption, and being capable of achieving flexible displaying and is thus regarded as a "dream display". In addition, the investment of manufacturing installation is far less than that of liquid crystal displays so that it has attracted the attention of major display manufacturers and becomes the mainstream of the third-generation display devices of the field of displaying technology.

Heretofore, several technical passageways have been proposed to achieve coloring of OLEDs, one being emission of light on the basis of three primary colors of red, green, and blue (RGB), of which Samsung Company is a representative manufacturer. This technique is only applicable to organic small molecule materials that are easy to sublimate but has advantages in respect of being a mature technique and easy to operate. However, due to the requirement of masks of high precision and alignment of high accuracy in making high resolution display screens, the productivity is relatively low and the cost is high. Further, due the great difference in respect of lifespan, excitability, and degree of attenuation among the three primary colors, color shifting of a color display device may result.

Another technique is one that uses white light plus RGB filter (Color Filter, CF), of which a representative manufacturer is LG Corp. Since the mature technique of color filer of LCD is involved, there is no need for mask alignment, so that a vapor deposition process can be greatly simplified and the manufacture cost can be reduced, allowing for application thereof in manufacturing large-sized OLEDs of high definitions. However, since the color filter absorbs a great amount of optical energy, only 30% of the optical energy can transmit therethrough so that a white light material of high performance must be used, otherwise the efficiency of a display device would be relatively low and a general use being small molecule OLED display screens.

Inorganic quantum dot possesses advantages, such as photoluminescence, stable performance, long lifespan, wide absorption spectrum, and good color purity, and is widely used in fluorescent probes and medical diagnoses, making it an excellent photoluminescent material particularly suitable for serving as a material for a color filter (CF) or a color change material (CCM) layer of an OLED. However, applications in this field have not been known or proposed.

Thus, it is desired to develop a color display device of which the manufacture technique is simple, color purity is high, light effect is good, stability is high, and thickness is reduced.

SUMMARY OF THE INVENTION

An object of the present invention is to provide a color display device, which uses an arrangement of a white light emission layer and a color change layer to make the color display device emitting various colors of light, where the color display device has a simple manufacturing technique and a reduced cost and a color filter layer of the color changer layer is made of a quantum dot material to achieve relatively high color purity of the color display device.

To achieve the object, the present invention provides a color display device, which comprises: a substrate, an anode formed on the substrate, a thin-film transistor (TFT) array formed on the anode, a hole injection layer formed on the TFT array, a hole transporting layer formed on the hole injection layer, a white light emission layer formed on the hole transporting layer, an electron transporting layer formed on the white light emission layer, a cathode formed on the electron transporting layer, a cover plate disposed above the cathode and bonded to the substrate, a color change layer formed on an inside surface of the cover plate, and a sealing enclosure resin bonding the substrate and the cover plate together, wherein the white light emission layer emits white light and the color change layer comprises a blue sub-pixel zone, a green sub-pixel zone, a red sub-pixel zone, and a white sub-pixel zone that are spaced from each other, the blue sub-pixel zone comprising a blue light filter layer formed therein, the green sub-pixel zone comprising a green light filter layer or a green light change layer formed therein, the red sub-pixel zone comprising a red light filter layer or a red light change layer formed therein, the white sub-pixel zone comprising no filter layer formed therein.

The TFT array comprises a TFT controlling emission of white light from the white light emission layer.

The white light emission layer is formed through thermal evaporation and the white light emission layer comprises a single-layer structure or a composite-layered structure.

When the white light emission layer comprises the single-layer structure, the single-layer structure comprises a material that is a mixture material formed of an organic blue light host material doped with a blue light emissive material, a green light emissive material, and a red light emissive material or a mixture material formed of a blue light emissive material doped with a yellow light emissive material.

The organic blue light host material comprises 4,4',4''-tri(carbazol-9-yl)-triphenylamine or 2,4,6-tri(9H-carbazol-9-yl)-1,3,5-triazine; the blue light emissive material comprises polyfluorenes, 4,4'-bis(2,2-diphenylvinyl)-1,1'-biphenyl or $FIr_6$; the green light emissive material comprises tris(2-phenylpyridine)iridium; the red light emissive material comprises tris(1-phenylisoquinoline)iridium(III); the yellow light emissive material comprises 5,6,11,12-Tetraphenyl-naphthacene.

The blue light filter layer is formed of a blue quantum dot material; the green light filter layer is formed of a green quantum dot material; and the red light filter layer is formed of a red quantum dot material.

The red quantum dot material comprises CdSe/CdS/ZnS; the green quantum dot material comprises CdSe/ZnS or $ZnSe:Cu^{2+}$; and the blue quantum dot material comprises ZnCdS, CdSe/ZnS or nanometer $SiN_4$.

The blue light filter layer is formed by mixing the blue quantum dot material with a surface coating agent and a solvent, coating and volatizing to remove the solvent; the green light filter layer or the green change layer is formed by mixing the green quantum dot material with a surface coating agent and a solvent, coating and volatizing to remove the solvent; and the red light filter layer or the red change layer is formed by mixing the red quantum dot material with a surface coating agent and a solvent, coating and volatizing to remove the solvent.

The substrate and the cover plate are each made of glass or a flexible material and at least one of the substrate and the cover plate is light-transmittable.

The electron transporting layer comprises a material of tris-(8-hydroxyquinolinato)aluminum; the hole transporting layer comprises a material of poly(triphenylamine); and the hole injection layer comprises a material of poly(ethylene-dioxythiophene).

The efficacy of the present invention is that the present invention provides a color display device, which uses an arrangement of a white light emission layer and a color change layer to make the color display device emitting various colors of light. The white light emission layer is formed through a thermal evaporation process so that there is no need of a fine metal mask in a manufacturing process, making the manufacturing technique simple and the cost reduced. Quantum dot materials are used to make color filter layers of the color change layer so as to take advantage of the advantages of stabilization of performance, extended lifespan, wide absorption spectrum, and good color purity of the inorganic quantum dots to make color purity of the color display device relatively high. Further, the color display device of the present invention features is ultra-thin, transparent, and easy to deflect and, compared to the known LCDs and LEDs, is readily formed on a flexible substrate. With a white sub-pixel zone being included in the color change layer, a device may save power consumption when display a white screen. Since the white sub-pixel zone does not include any filter layer formed thereon, the manufacturing cost can be better saved.

BRIEF DESCRIPTION OF THE DRAWINGS

The technical solution, as well as beneficial advantages, of the present invention will be apparent from the following detailed description of an embodiment of the present invention, with reference to the attached drawings. In the drawings.

DETAILED DESCRIPTION OF THE PREFERRED EMBODIMENTS

To further expound the technical solution adopted in the present invention and the effectiveness thereof, a detailed description will be given to a preferred embodiment of the present invention and the attached drawings.

Figure 1:
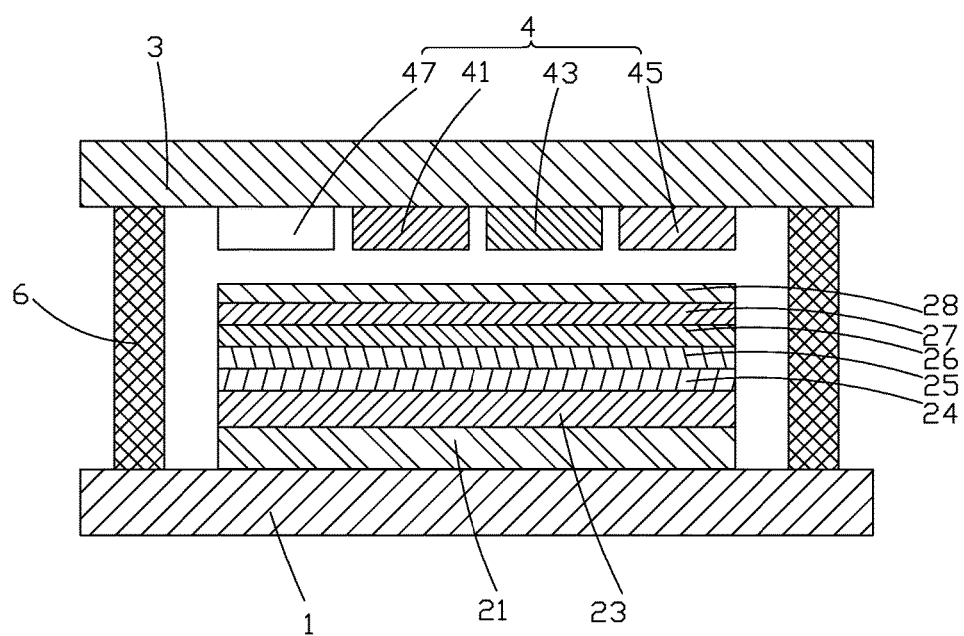
FIG. 1 is a schematic view showing the structure of a color display device according to the present invention.

Referring to FIG. 1, the present invention provides a color display device, which comprises a substrate 1, an anode 21 formed on the substrate 1, a thin-film transistor (TFT) array 23 formed on the anode 21, a hole injection layer 24 formed on the TFT array 23, a hole transporting layer 25 formed on the hole injection layer 24, a white light emission layer 26 formed on the hole transporting layer 25, an electron transporting layer 27 formed on the white light emission layer 26, a cathode 28 formed on the electron transporting layer 27, a cover plate 3 disposed above the cathode 28 and bonded to the substrate 1, a color change layer 4 formed on an inside surface of the cover plate 3, and a sealing enclosure resin 6 bonding the substrate 1 and the cover plate 3 together.

The white light emission layer 26 emits white light. The color change layer 4 comprises a blue sub-pixel zone 41, a green sub-pixel zone 43, a red sub-pixel zone 45, and white sub-pixel zone 47 that are spaced from each other. The blue sub-pixel zone 41 comprises a blue light filter layer formed therein. The green sub-pixel zone 43 comprises a green light filter layer formed therein. The red sub-pixel zone 45 comprises a red light change layer formed therein. The white sub-pixel zone 47 is empty, namely white light emitting from the white light emission layer 26 directly transmits through the white sub-pixel zone 47.

As an optional alternative embodiment, the green sub-pixel zone 43 may comprise a green light change layer formed therein, while the red sub-pixel zone 45 comprises a red light filter layer formed therein.

The blue light, green light, and red light filter layers adopts the principle of a color filter (CF) to perform light filtering in order to obtain a desired color of light. The green light and red light change layers use color change material (CCM) to change white light into a desired color of light.

White light emitting from the white light emission layer 26 is changed by the blue sub-pixel zone 41 of the color change layer 4 into blue light. White light emitting from the white light emission layer 26 is changed by the green sub-pixel zone 43 of the color change layer 4 into green light. White light emitting from the white light emission layer 26 is changed by the red sub-pixel zone 45 of the color change layer 4 into red light. White light emitting from the white light emission layer 26 remains white light after transmitting through the white sub-pixel zone 47 of the color change layer 4.

The sub-pixel zones of the color change layer 4 each correspond to one TFT of the TFT array 23 in order to allow the TFT to control the emission of white light from an area of the white light emission layer 26 that corresponds to the sub-pixel zone.

Preferably, the white light emission layer 26 is formed through thermal evaporation. Specifically, the white light emission layer 26 may comprise a single-layer structure to emit white light or a composite-layer structure to give off compound lights to provide white light.

When the white light emission layer 26 comprises a single-layer structure, the single-layer structure comprises a material that is a mixture material formed of an organic blue light host material doped with a blue light emissive material, a green light emissive material, and a red light emissive material or, alternatively, a mixture material formed of a blue light emissive material doped with a yellow light emissive material.

When the white light emission layer 26 comprises a composite-layered structure, the white light emission layer 26 may comprise a three layer structure or a two layer structure.

When the white light emission layer 26 comprises a three layer structure, the three layer structure may comprise layers respectively comprising a mixture material formed of an organic blue light host material doped with a blue light emissive material, a mixture material formed of an organic blue light host material doped with a green light emissive material, and a mixture material formed of an organic blue light host material doped with a red light emissive material.

When the white light emission layer 26 comprises a two layer structure, the two layer structure may comprise layers respectively comprising a mixture material formed of an organic blue light host material doped with a blue light emissive material and a green light emissive material and a mixture material formed of an organic blue light host material doped with a red light emissive material.

The layers of the two layer structure may alternatively comprise materials that are respectively a mixture material formed of an organic blue light host material doped with a red light emissive material and a green light emissive material and a mixture material formed of an organic blue light host material doped with a blue light emissive material.

The layers of the two layer structure may further alternatively comprise materials that are respectively a mixture material formed of an organic blue light host material doped with a red light emissive material and a blue light emissive material and a mixture material formed of an organic blue light host material doped with a green light emissive material.

The layers of the two layer structure may further alternatively comprise materials that are respectively a blue light emissive material and a yellow light emissive material.

The organic blue light host material can be 4,4',4"-tri(carbazol-9-yl)-triphenylamine (TCAC) or 2,4,6-tri(9H-carbazol-9-yl)-1,3,5-triazine (TRZ). The blue light emissive material can be polyfluorenes, 4,4'-bis(2,2-diphenylvinyl)-1,1'-biphenyl (DPVBi) or FIr$_6$. The green light emissive material can be tris(2-phenylpyridine)iridium (Ir(ppy)$_3$). The red light emissive material can be tris(1-phenylisoquinoline)iridium(III) (Ir(piq)$_3$). The yellow light emissive material can be 5,6,11,12-Tetraphenylnaphthacene (rubrene).

The organic blue light host material, 4,4',4"-tri(carbazol-9-yl)-triphenylamine (TCAC), has a structural formula as follows:

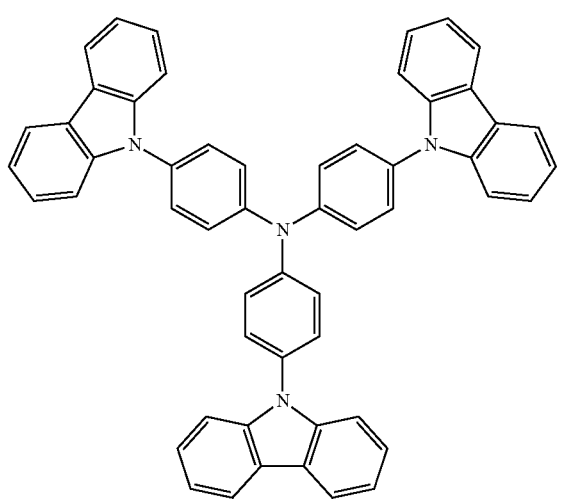

The above-mentioned 2,4,6-tri(9H-carbazol-9-yl)-1,3,5-triazine (TRZ) has a structural formula as follows:

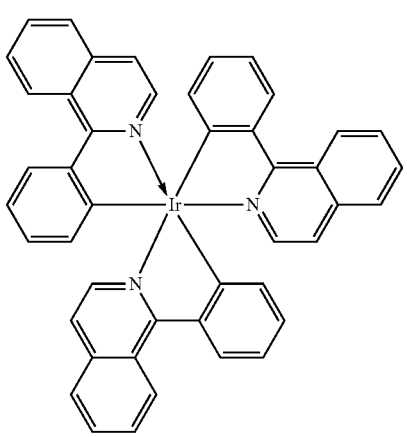

The above-mentioned tris(2-phenylpyridine)iridium (Ir(ppy)$_3$) has a structural formula as follows:

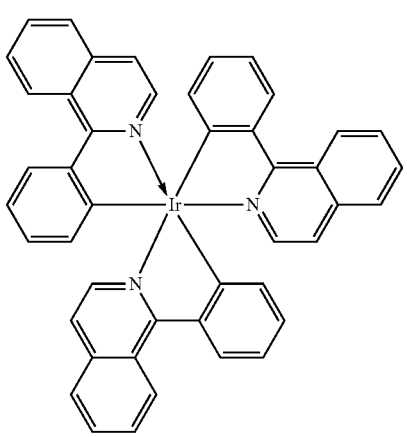

The above-mentioned tris(1-phenylisoquinoline)iridium(III) (Ir(piq)$_3$) has a structural formula as follows:

The organic yellow light emissive material, 5,6,11,12-Tetraphenylnaphthacene (rubrene), has a structural formula as follows:

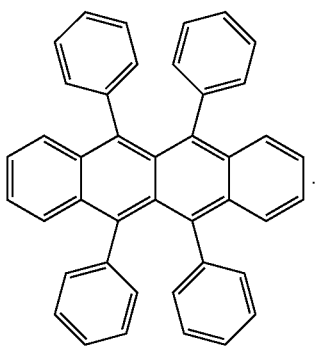 [SMILES: c1ccc(-c2c3ccccc3c(-c3ccccc3)c3c(-c4ccccc4)c4ccccc4c(-c4ccccc4)c23)cc1]

Since the white light emission layer 26 is formed through a thermal evaporation process, there is no need to use a fine metal mask (FMM) in the manufacture thereof and the white light emission layer has a thickness of several hundred nanometers so that the manufacturing technique of the structure of the color display device is simple and the cost is relatively low.

Preferably, the blue light filter layer is formed of a blue quantum dot material; the green light filter layer or the red light change layer is formed of a green quantum dot material; and the red light filter layer or the red light change layer is formed of a red quantum dot material.

The red quantum dot material can be CdSe/CdS/ZnS; the green quantum dot material can be CdSe/ZnS or ZnSe:$Cu^{2+}$; and the blue quantum dot material can be ZnCdS, CdSe/ZnS or nanometer $SiN_4$.

Specifically, the blue light filter layer is formed by mixing the blue quantum dot material with a surface coating agent and a solvent, coating and volatizing to remove the solvent; the green light filter layer is formed by mixing the green quantum dot material with a surface coating agent and a solvent, coating and volatizing to remove the solvent; and the red light filter layer is formed by mixing the red quantum dot material with a surface coating agent and a solvent, coating and volatizing to remove the solvent.

It is noted that since a quantum dot is a nanometer particle, which is a zero-dimensional material, and has great surface activity and is easy to aggregate so as to lead to oxidization and quenching of fluorescence, the surface coating agent is added during a manufacture process to prevent aggregation and oxidization of the quantum dot. Preferably, the surface coating agent comprises stearic acid, trioctylphosphine oxide, or poly(methyl methacrylate) (PMMA).

Specifically, the substrate 1 and the cover plate 3 can be glass sheets or flexible materials and at least one of them is light-transmittable. It is preferred that both the substrate 1 and the cover plate 3 are glass sheets. The sealing enclosure resin 6 functions to prevent invasion of external moisture and oxygen in order to protect internal electronic components.

The hole injection layer 24 may comprises a material of poly(ethylenedioxythiophene) (PEDOT). The hole transporting layer 25 may comprises a material of poly(triphenylamine) (poly-TPD). The electron transporting layer 27 may comprises a material of tris-(8-hydroxyquinolinato) aluminum ($Alq_3$).

Figure 2:
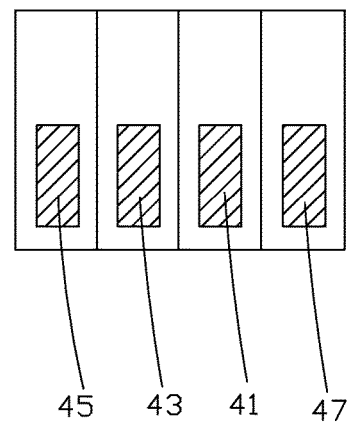
FIG. 2 is a schematic plan view illustrating an arrangement of pixels of a color display device according to the present invention.
Figure 3:
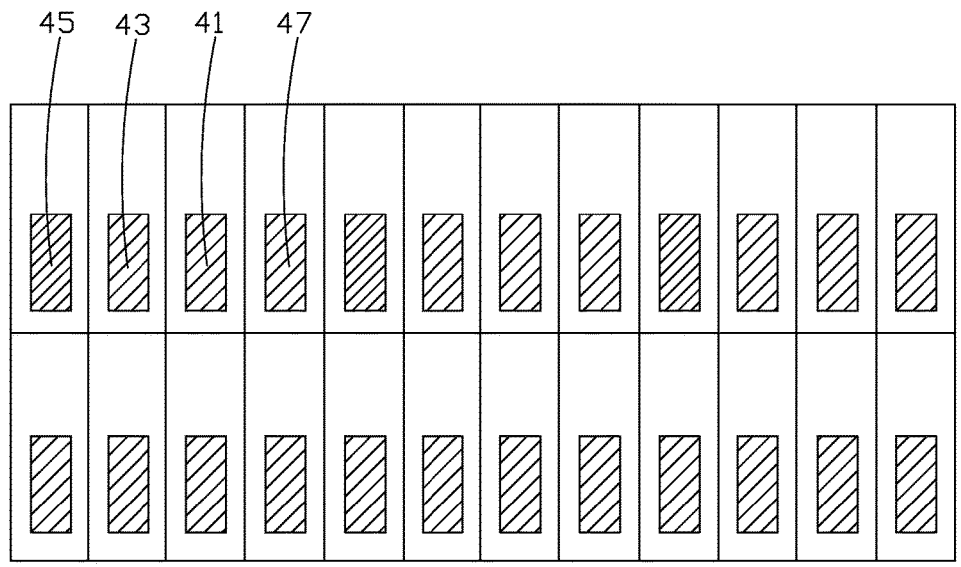
FIG. 3 is a schematic view illustrating the arrangement of pixels shown in FIG. 2 used in a display panel.
Figure 4:
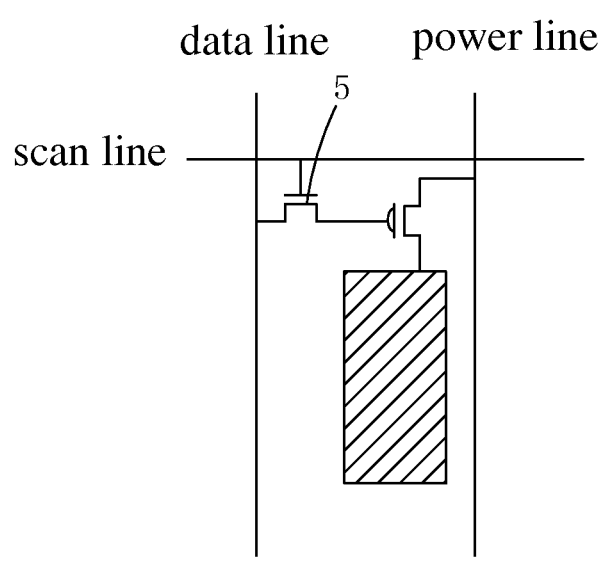
FIG. 4 is a schematic view showing a structure of a thin-film transistor (TFT) drive circuit for the arrangement of pixels shown in FIG. 2.

Referring to FIG. 2, which is a schematic plan view illustrating an arrangement of pixels of the color display device according to the present invention, the white light emission layer 26 comprises a single pixel on an entire surface thereof, the blue sub-pixel zone 41, areas to which the green sub-pixel zone 43, and the red sub-pixel zone 45 correspond are the same sub-pixel. FIG. 3 is a schematic view illustrating the arrangement of pixels shown in FIG. 2 used in a display panel. As shown in FIG. 4, the TFT 5 drives the white light emission layer 26 to emit white light. With application of electricity thereto, the white light emission layer 26 is entirely lit in the entire surface. The white light transmits through and is subjected to filtration by the blue light filter layer, the green light filter layer, and the red light filter layer of the color change layer 4 to respectively turn into blue light, green light, and red light. The white light remains white light after transmitting through the white sub-pixel zone (comprising no filter layer arranged thereon) of the color change layer 4.

Figure 5:
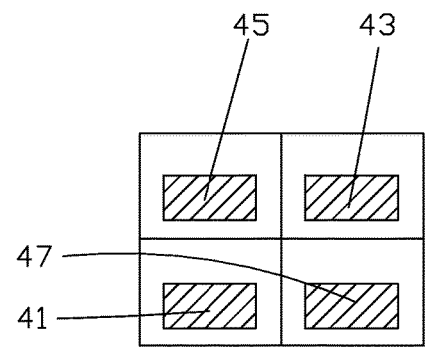
FIG. 5 is a schematic plan view illustrating another arrangement of pixels of a color display device according to the present invention.
Figure 6:
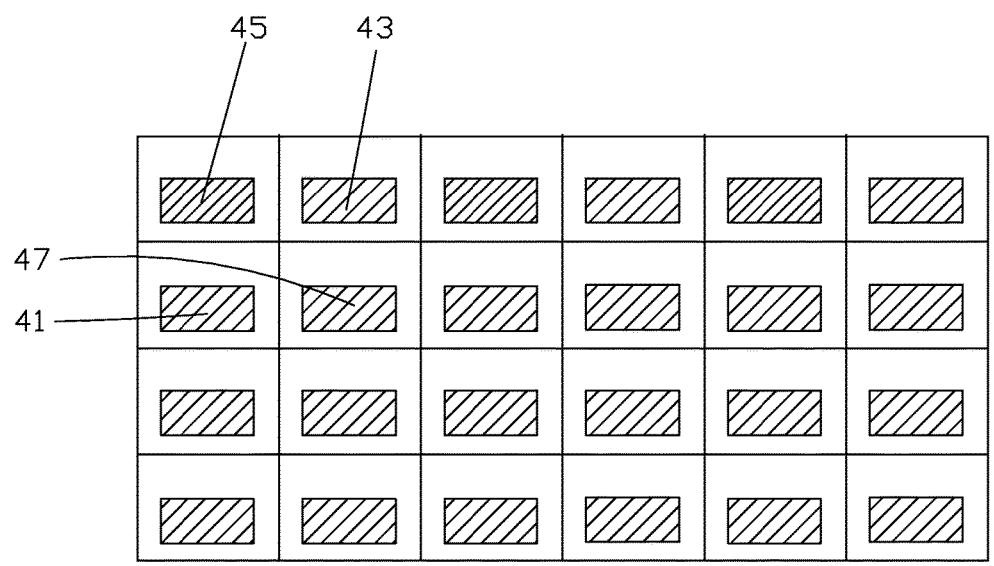
FIG. 6 is a schematic view illustrating the arrangement of pixels shown in FIG. 5 used in a display panel.

Referring to FIG. 5, which is a schematic plan view illustrating another arrangement of pixels of a color display device according to the present invention. FIG. 6 is a schematic view illustrating the arrangement of pixels shown in FIG. 5 used in a display panel.

In summary, the present invention provides a color display device, which uses an arrangement of a white light emission layer and a color change layer to make the color display device emitting various colors of light. The white light emission layer is formed through a thermal evaporation process so that there is no need of a fine metal mask in a manufacturing process, making the manufacturing technique simple and the cost reduced. Quantum dot materials are used to make color filter layers of the color change layer so as to take advantage of the advantages of stabilization of performance, extended lifespan, wide absorption spectrum, and good color purity of the inorganic quantum dots to make color purity of the color display device relatively high. Further, the color display device of the present invention features is ultra-thin, transparent, and easy to deflect and, compared to the known LCDs and LEDs, is readily formed on a flexible substrate. With a white sub-pixel zone being included in the color change layer, a device may save power consumption when display a white screen. Since the white sub-pixel zone does not include any filter layer formed thereon, the manufacturing cost can be better saved.

Based on the description given above, those having ordinary skills of the art may easily contemplate various changes and modifications of the technical solution and technical ideas of the present invention and all these changes and modifications are considered within the protection scope of right for the present invention.

What is claimed is:

1. A color display device, comprising: a substrate, an anode formed on the substrate, a thin-film transistor (TFT) array formed on the anode, a hole injection layer formed on the TFT array, a hole transporting layer formed on the hole injection layer, a white light emission layer formed on the hole transporting layer, an electron transporting layer formed on the white light emission layer, a cathode formed on the electron transporting layer, a cover plate disposed above the cathode and bonded to the substrate, a color change layer formed on an inside surface of the cover plate, and a sealing enclosure resin bonding the substrate and the cover plate together, wherein the white light emission layer emits white light and the color change layer comprises a blue sub-pixel zone, a green sub-pixel zone, a red sub-pixel zone, and a white sub-pixel zone that are spaced from each other, the blue sub-pixel zone comprising a blue light filter layer formed therein, the green sub-pixel zone comprising a green light filter layer or a green light change layer formed therein, the red sub-pixel zone comprising a red light filter layer or a red light change layer formed therein, the white sub-pixel zone being empty;

wherein the white light emission layer comprises a single-layer structure, which comprises a material that is a mixture material formed of an organic blue light host material doped with a plurality of different light emissive materials, wherein the different light emissive materials comprise a blue light emissive material, a green light emissive material, and a red light emissive material; and wherein the organic blue light host material comprises 2,4,6-tri(9H-carbazol-9-yl)-1,3,5-triazine, which is mixed with at least the blue light emissive material comprising polyfluorenes, 4,4'-bis(2,2-diphenylvinyl)-1,1'-biphenyl or $FIr_6$.

2. The color display device as claimed in claim 1, wherein the TFT array comprises a TFT controlling emission of white light from the white light emission layer.

3. The color display device as claimed in claim 1, wherein the white light emission layer is formed through thermal evaporation.

4. The color display device as claimed in claim 1, wherein the green light emissive material comprises tris(2-phenylpyridine)iridium and the red light emissive material comprises tris(1-phenylisoquinoline)iridium(III).

5. The color display device as claimed in claim 1, wherein the blue light filter layer is formed of a blue quantum dot material; the green light filter layer or the green light change layer is formed of a green quantum dot material; and the red light filter layer or the red light change layer is formed of a red quantum dot material.

6. The color display device as claimed in claim 5, wherein the red quantum dot material comprises CdSe/CdS/ZnS; the green quantum dot material comprises CdSe/ZnS or ZnSe:$Cu^{2+}$; and the blue quantum dot material comprises ZnCdS, CdSe/ZnS or nanometer $SiN_4$.

7. The color display device as claimed in claim 5, wherein the blue light filter layer is formed by mixing the blue quantum dot material with a surface coating agent and a solvent, coating and volatizing to remove the solvent; the green light filter layer is formed by mixing the green quantum dot material with a surface coating agent and a solvent, coating and volatizing to remove the solvent; and the red light filter layer is formed by mixing the red quantum dot material with a surface coating agent and a solvent, coating and volatizing to remove the solvent.

8. The color display device as claimed in claim 1, wherein the substrate and the cover plate are each made of glass or a flexible material and at least one of the substrate and the cover plate is light-transmittable.

9. The color display device as claimed in claim 1, wherein the electron transporting layer comprises a material of tris-(8-hydroxyquinolinato)aluminum; the hole transporting layer comprises a material of poly(triphenylamine); and the hole injection layer comprises a material of poly(ethylenedioxythiophene).

10. A color display device, comprising: a substrate, an anode formed on the substrate, a thin-film transistor (TFT) array formed on the anode, a hole injection layer formed on the TFT array, a hole transporting layer formed on the hole injection layer, a white light emission layer formed on the hole transporting layer, an electron transporting layer formed on the white light emission layer, a cathode formed on the electron transporting layer, a cover plate disposed above the cathode and bonded to the substrate, a color change layer formed on an inside surface of the cover plate, and a sealing enclosure resin bonding the substrate and the cover plate together, wherein the white light emission layer emits white light and the color change layer comprises a blue sub-pixel zone, a green sub-pixel zone, a red sub-pixel zone, and a white sub-pixel zone that are spaced from each other, the blue sub-pixel zone comprising a blue light filter layer formed therein, the green sub-pixel zone comprising a green light filter layer or a green light change layer formed therein, the red sub-pixel zone comprising a red light filter layer or a red light change layer formed therein, the white sub-pixel zone being empty;

wherein the TFT array comprises a TFT controlling emission of white light from the white light emission layer;

wherein the white light emission layer is formed through thermal evaporation;

wherein the white light emission layer comprises a single-layer structure, which comprises a material that is a mixture material formed of an organic blue light host material doped with a plurality of different light emissive materials, wherein the different light emissive materials comprise a blue light emissive material, a green light emissive material, and a red light emissive material;

wherein the organic blue light host material comprises 2,4,6-tri(9H-carbazol-9-yl)-1,3,5-triazine, which is mixed with at least the blue light emissive material comprising polyfluorenes, 4,4'-bis(2,2-diphenylvinyl)-1,1'-biphenyl or $FIr_6$;

wherein the green light emissive material comprises tris(2-phenylpyridine)iridium and the red light emissive material comprises tris(1-phenylisoquinoline)iridium (III);

wherein the blue light filter layer is formed of a blue quantum dot material; the green light filter layer or the green light change layer is formed of a green quantum dot material; and the red light filter layer or the red light change layer is formed of a red quantum dot material;

wherein the red quantum dot material comprises CdSe/CdS/ZnS; the green quantum dot material comprises CdSe/ZnS or ZnSe:$Cu^{2+}$; and the blue quantum dot material comprises ZnCdS, CdSe/ZnS or nanometer $SiN_4$;

wherein the blue light filter layer is formed by mixing the blue quantum dot material with a surface coating agent and a solvent, coating and volatizing to remove the solvent; the green light filter layer is formed by mixing the green quantum dot material with a surface coating agent and a solvent, coating and volatizing to remove the solvent; and the red light filter layer is formed by mixing the red quantum dot material with a surface coating agent and a solvent, coating and volatizing to remove the solvent;

wherein the substrate and the cover plate are each made of glass or a flexible material and at least one of the substrate and the cover plate is light-transmittable; and wherein the electron transporting layer comprises a material of tris-(8-hydroxyquinolinato)aluminum; the hole transporting layer comprises a material of poly(triphenylamine); and the hole injection layer comprises a material of poly(ethylenedioxythiophene).

* * * * *